(12) United States Patent
Agarwal (10) Patent No.: US 7,389,452 B2
(45) Date of Patent: Jun. 17, 2008

(54) METHODS AND APPARATUS FOR MONITORING INTERNAL SIGNALS IN AN INTEGRATED CIRCUIT

(75) Inventor: Manoj Kumar Agarwal, San Mateo, CA (US)

(73) Assignee: Electronics For Imaging, Inc., Foster City, CA (US)

( * ) Notice: Subject to any disclaimer, the term of this patent is extended or adjusted under 35 U.S.C. 154(b) by 921 days.

(21) Appl. No.: 10/880,630

(22) Filed: Jun. 29, 2004

(65) Prior Publication Data

US 2005/0289418 A1    Dec. 29, 2005

(51) Int. Cl.
*G01R 31/28* (2006.01)
(52) U.S. Cl. ........................ 714/724; 714/30
(58) Field of Classification Search ................ 714/726, 714/727, 729, 724, 30; 326/41
See application file for complete search history.

(56) References Cited

U.S. PATENT DOCUMENTS

| | | | |
|---|---|---|---|
| 5,490,151 A * | 2/1996 | Feger et al. ................. | 714/727 |
| 5,594,366 A * | 1/1997 | Khong et al. ................. | 326/41 |
| 5,715,256 A * | 2/1998 | Mohd et al. ................ | 714/726 |
| 6,370,663 B1 * | 4/2002 | Kudo ......................... | 714/724 |
| 6,601,126 B1 | 7/2003 | Zaidi et al. | |
| 6,611,932 B2 | 8/2003 | How et al. | |
| 6,990,618 B1 * | 1/2006 | Lulla et al. ................. | 714/727 |
| 2003/0164718 A1 | 9/2003 | Emberling et al. | |
| 2004/0098643 A1 | 5/2004 | Schulz | |

\* cited by examiner

*Primary Examiner*—David Ton
(74) *Attorney, Agent, or Firm*—James Trosino (57) ABSTRACT

Apparatus and methods are provided for debugging an integrated circuit. Local multiplexer circuits are provided near first and second circuit blocks in the integrated circuit. Each multiplexer circuit includes input nodes, a control node, and an output node. A first input node of the first multiplexer circuit is coupled to an internal node of the first circuit block, a first input node of the second multiplexer circuit is coupled to an internal node of the second circuit block, second input nodes of the first and second multiplexer circuits are coupled to logical 0, and the control signal nodes of the first and second multiplexer circuits are coupled to a control signal. An OR gate is provided that includes an input node coupled to the output node of the first multiplexer circuit, another input node coupled to the output node of the second multiplexer circuit, and an output node. The control signal is used to select the internal nodes of the first or second circuit blocks for monitoring at the output node of the OR gate.

28 Claims, 6 Drawing Sheets

METHODS AND APPARATUS FOR MONITORING INTERNAL SIGNALS IN AN INTEGRATED CIRCUIT

BACKGROUND

This invention relates to apparatus and methods for debugging integrated circuits. More particularly, this invention pertains to apparatus and methods for monitoring dynamic or static internal signals in an integrated circuit.

Rapid advances in integrated circuit technology have enabled more and more electronic circuit elements to be implemented in smaller and smaller integrated circuit devices. As circuit density has increased, the functional complexity of integrated circuit devices has also increased. As a result, many products that include integrated circuits have become smaller, lighter, quieter, more powerful and more energy efficient. The trend toward increased integrated circuit functionality and decreased device size seems likely to continue for the foreseeable future. As integrated circuits have become more complex, however, the ability to test and debug integrated circuits has become more difficult. Further, conventional techniques for testing integrated circuits generally do not permit continuous monitoring of internal signals, such as in internal state machines, counters, flow control signals, data at various stages in the pipeline and any other dynamic or static signals of interest whose continuous observability could significantly simplify circuit debugging.

Figure 1:
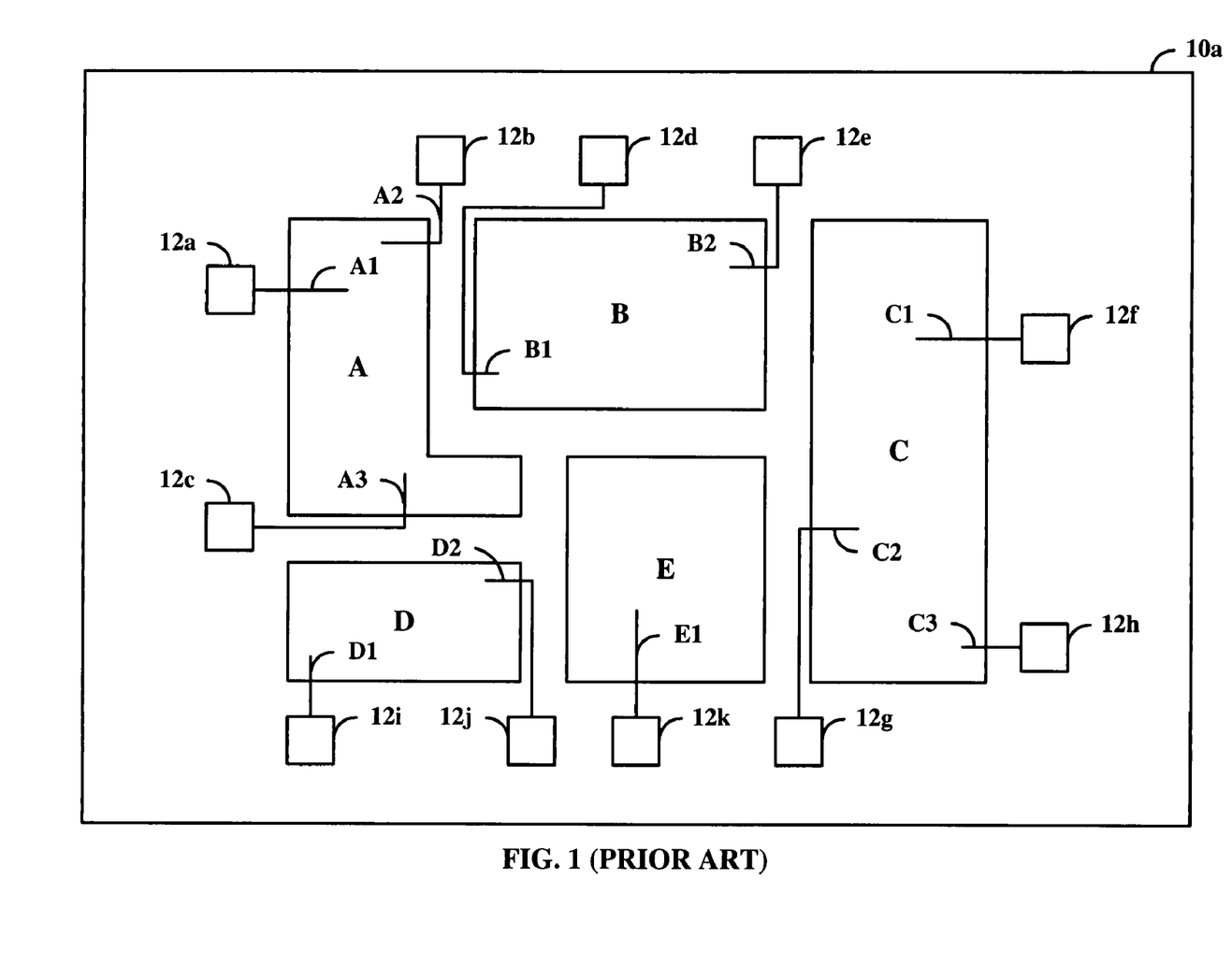
FIG. 1 is a block diagram of a previously known technique for monitoring internal signals in an integrated circuit.

A common technique for testing and debugging integrated circuits is described with reference to FIG. 1. Integrated circuit 10a includes circuit blocks A, B, C, D and E, each of which may include large numbers of electronic circuit elements and signals. For testing and debugging purposes, it may be desirable to monitor internal signals in each circuit block. For example, it may be desirable to monitor internal signals A1-A3, B1-B2, C1-C3, D1-D2 and E1 in circuit blocks A, B, C, D and E, respectively. To accomplish this goal, internal signals A1-A3, B1-B2, C1-C3, D1-D2 and E1 may be connected to external pins 12a-12k, respectively.

One problem with this previously known internal signal monitoring technique, however, is that it is not easily scalable. Indeed, to monitor three additional internal signals in integrated circuit 10, three additional external pins are required. Because an integrated circuit package can support only a limited number of external pins, the number of internal signals that may be routed to external pins often cannot be easily increased.

One previously known technique for solving the problem of limited external pin count is described with reference to FIG. 2. Integrated circuit 10b includes multiplexer ("MUX") 14, which has input nodes coupled to internal signals A1-A3, B1-B2, C1-C3, D1-D2 and E1, a control input node coupled to control signal SELECT, and an output node coupled to external pin 16. MUX 14 functions like a controllable switch, coupling one of internal signals A1-A3, B1-B2, C1-C3, D1-D2 and E1 to external pin 16 based on the value of control signal SELECT. Thus, if control signal SELECT is a four-bit signal, up to sixteen internal signals may be selectively coupled to external pin 16 via MUX 14. To route additional internal signals from circuit 10b to external pin 16, additional input nodes may be added to MUX 14, and the bit size of control signal SELECT may be increased. Alternatively, if another external pin is available, the additional internal signals may be routed to a second MUX, which may be controlled using a second multi-bit control signal.

There are several problems, however, with this previously known internal signal monitoring technique. First, circuit 10b may be susceptible to increased noise and crosstalk issues. Indeed, because internal signals A1-A3, B1-B2, C1-C3, D1-D2 and E1 may need to be routed over relatively long distances to MUX 14, the internal signals may interfere with the operation of circuitry adjacent to the long signal traces. Although various layout techniques may be used to minimize the effect of such noise and crosstalk, such techniques typically consume valuable real estate and increase the size of the integrated circuit device.

Figure 2:
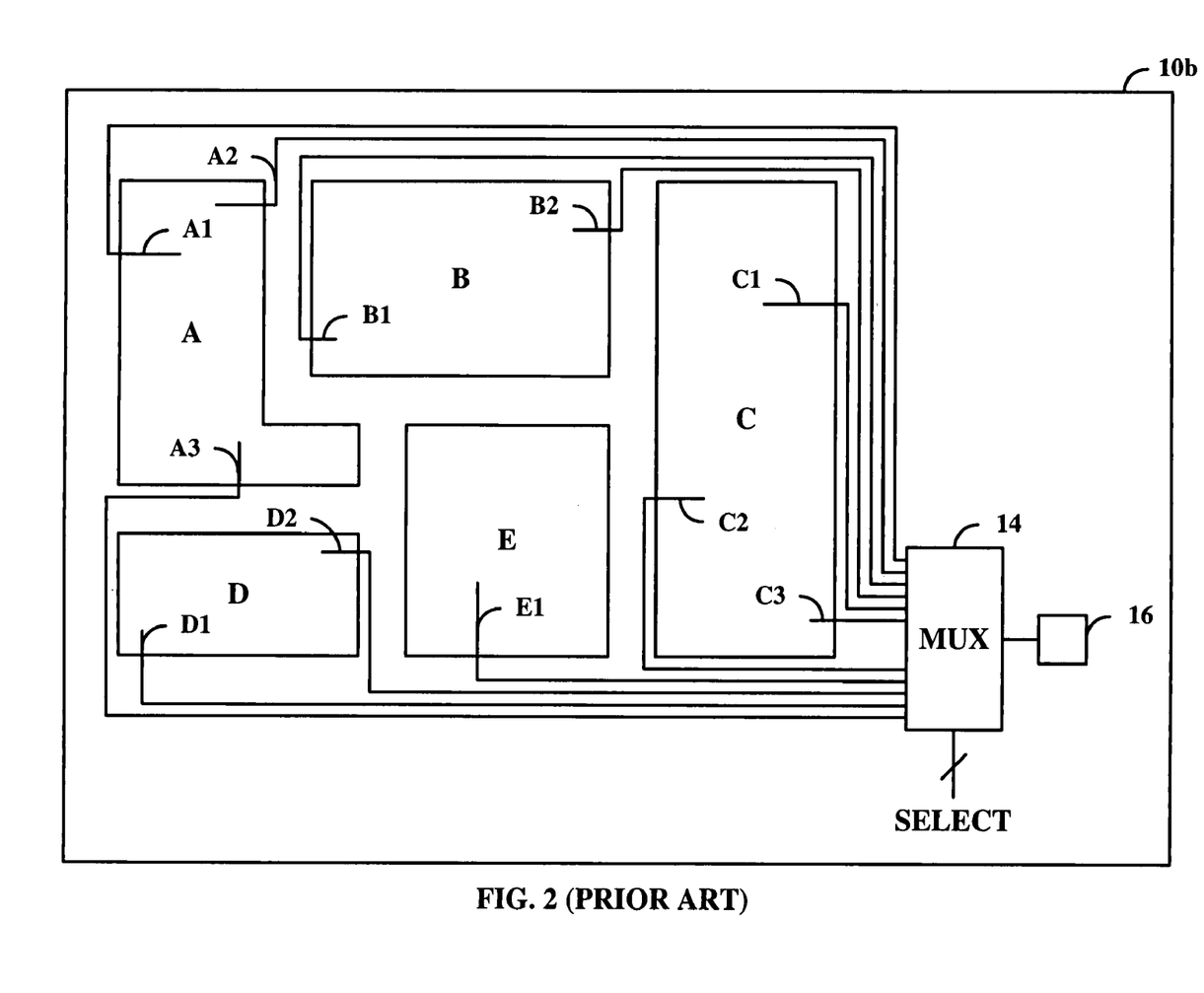
FIG. 2 is a block diagram of another previously known technique for monitoring internal signals in an integrated circuit.

In addition, the technique illustrated in FIG. 2 is inefficient in terms of size and power consumption, particularly as the number of monitored signals increases. Indeed, as more internal signals are monitored, the amount of space required to route the various signals to MUX 14, and the size of the MUX itself, becomes prohibitively large. Further, because the monitored signals typically toggle at a very high clock rate, the power required to drive these simultaneously active signals over long signal traces from the internal circuit nodes to MUX 14 becomes unacceptably high.

Moreover, the technique in FIG. 2 is not practically scalable. Indeed, when an internal signal trace is added to a circuit block, the trace often must be routed through numerous other circuit blocks on the integrated circuit. Because the various circuit blocks may be designed by multiple engineers, the addition by one engineer of the single internal signal trace may need to be communicated to all the engineers who worked on the integrated circuit, and may impact all of other circuit blocks. As a result, the technique shown in FIG. 2 is not practical.

In view of the foregoing, it would be desirable to provide improved methods and apparatus for monitoring internal signals in integrated circuits.

It further would be desirable to provide lower noise methods and apparatus for monitoring internal signals in integrated circuits.

It additionally would be desirable to provide scalable methods and apparatus for monitoring internal signals in integrated circuits.

It also would be desirable to provide area-efficient methods and apparatus for monitoring internal signals in integrated circuits.

It moreover would be desirable to provide power-efficient methods and apparatus for monitoring internal signals in integrated circuits.

SUMMARY

In view of the foregoing, it is an object of this invention to provide improved methods and apparatus for monitoring internal signals in integrated circuits.

It further is an object of this invention to provide lower noise methods and apparatus for monitoring internal signals in integrated circuits.

It additionally is an object of this invention to provide scalable methods and apparatus for monitoring internal signals in integrated circuits.

It also is an object of this invention to provide area-efficient methods and apparatus for monitoring internal signals in integrated circuits.

It moreover is an object of this invention to provide power-efficient methods and apparatus for monitoring internal signals in integrated circuits.

These and other objects of this invention are accomplished by providing local multiplexer circuits near first and second circuit blocks in an integrated circuit. Each multiplexer circuit includes first and second input nodes, a control node, and an output node. The first input node of the first multiplexer circuit is coupled to an internal node of the first circuit block, the first input node of the second multiplexer circuit is coupled to an internal node of the second circuit block, the second input nodes of the first and second multiplexer circuits are coupled to logical 0, and the control signal nodes of the first and second multiplexer circuits are coupled to a control signal. An OR gate is provided that includes a first input node coupled to the output node of the first multiplexer circuit, a second input node coupled to the output node of the second multiplexer circuit, and an output node. The control signal is used to select the internal node of the first circuit block or the internal node of the second circuit block for monitoring at the output node of the OR gate.

BRIEF DESCRIPTION OF THE DRAWINGS

The above-mentioned objects and features of the present invention can be more clearly understood from the following detailed description considered in conjunction with the following drawings, in which the same reference numerals denote the same elements throughout, and in which.

DETAILED DESCRIPTION

Figure 3:
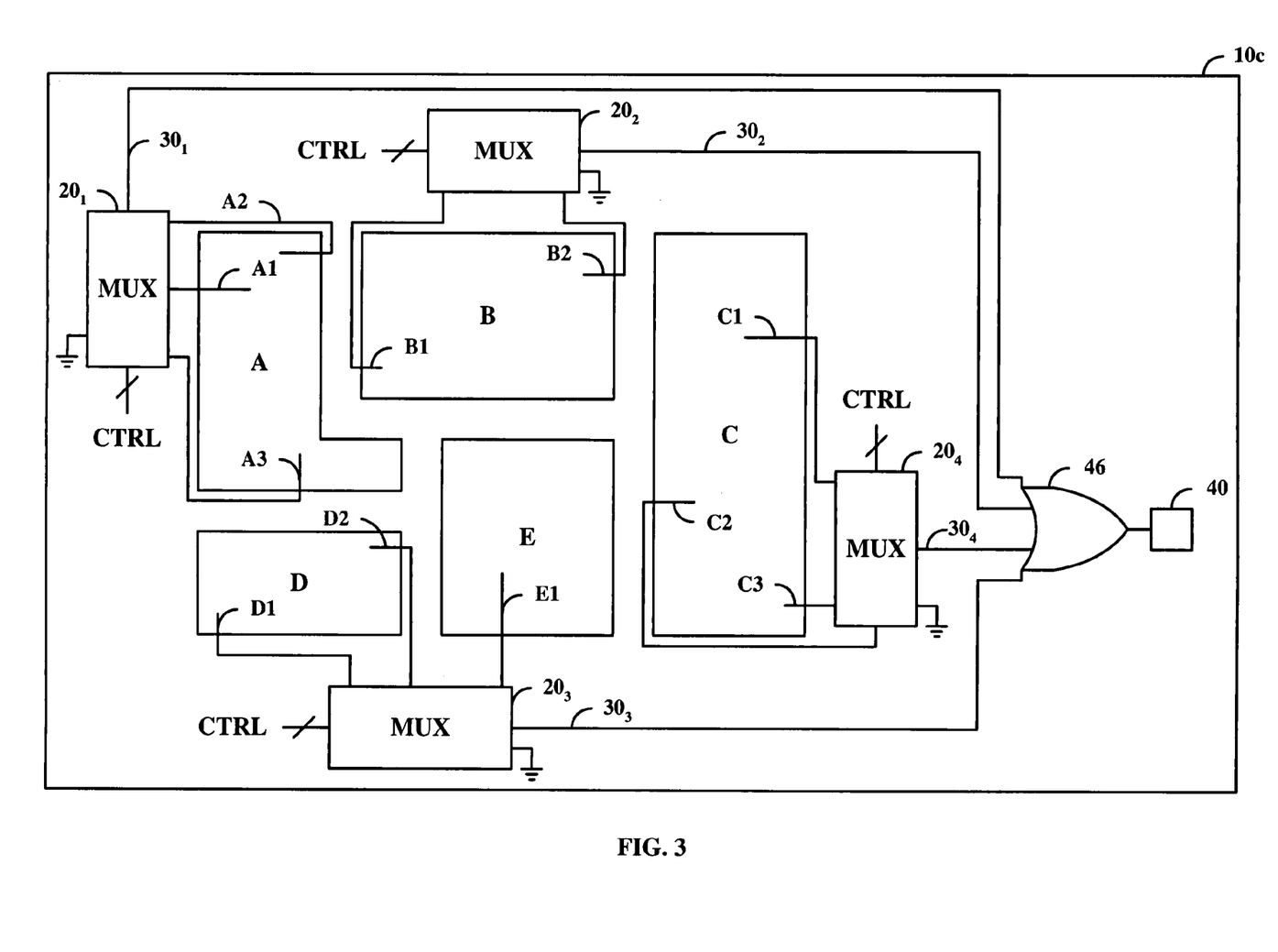
FIG. 3 is a block diagram of an exemplary circuit for monitoring internal signals in an integrated circuit in accordance with this invention.

Referring to FIG. 3, an illustrative embodiment of a circuit for monitoring internal signals in integrated circuits in accordance with this invention is described. Circuit $10c$ includes MUX circuits $20_1$-$20_4$ and output OR gate 46. MUX $20_1$ has input nodes coupled to internal signals A1-A3 and a voltage reference, a control input node coupled to control signal CTRL, and an output node $30_1$ coupled to a first input node of output OR gate 46. The voltage reference is a voltage on integrated circuit $10c$ that corresponds to logical 0. For example, the reference voltage may be zero volts, the midpoint of the positive and negative supply voltages, or some other reference voltage level that corresponds to logical 0. For convenience, the reference voltage is referred to herein as "Logical 0."

MUX $20_2$ has input nodes coupled to internal signals B1-B2 and Logical 0, a control input node coupled to control signal CTRL, and an output node $30_2$ coupled to a second input node of output OR gate 46. MUX $20_3$ has input nodes coupled to internal signals D1, D2, E1 and Logical 0, a control input node coupled to control signal CTRL, and an output node $30_3$ coupled to a third input node of output OR gate 46. MUX $20_4$ has input nodes coupled to internal signals C1-C3 and Logical 0, a control input node coupled to control signal CTRL, and an output node $30_4$ coupled to a fourth input node of output OR gate 46. Output OR gate 46 has an output node coupled to one or more external pins 40.

MUXES $20_1$-$20_4$ are "local" MUX circuits that are located near the source of internal signals that are to be monitored. Thus, local MUX $20_1$ is located near circuit block A, local MUX $20_2$ is located near circuit block B, local MUX $20_3$ is located near circuit blocks D and E, and local MUX $20_4$ is located near circuit block C. As a result, the routing distances between internal signals A1-A3, B1-B2, C1-C3, D1-D2 and E1 and the corresponding local MUX are relatively short. As illustrated in FIG. 3, local MUXES $20_1$-$20_4$ may be located on an outside periphery of circuit blocks A-E. Alternatively, one or more of local MUXES $20_1$-$20_4$ may be embedded within circuit blocks A-E.

The number of input nodes per local MUX may be limited to keep the MUX size relatively small. For example, local MUXES $20_1$-$20_4$ each may include two, four eight, sixteen, or some other relatively small number of input nodes. In the exemplary embodiment of FIG. 3, local MUXES $20_1$-$20_4$ each include four input nodes. Internal signals A1-A3, B1-B2, C1-C3, D1-D2 and E1 may be single-bit or multi-bit signals. In addition, output nodes $30_1$-$30_4$ and the output node of output OR gate 46 may be single bit or multi-bit output nodes. MUXES $20_1$-$20_4$ need not all have the same number of input nodes, and all input nodes need not have the same bit size. For purposes of uniformity, however, it may be desirable to use a single "standard" local MUX that has a fixed number of input nodes, where each input node and the output node have a fixed number of bits. For example, a standard MUX may have four input nodes, with each input node and the output node having sixty-four bits. For sake of simplicity, unless otherwise indicated, the following sections describe the invention in terms of single-bit signals. Persons of ordinary skill in the art will understand, however, that apparatus and methods in accordance with this invention may be implemented using multi-bit signals.

Each of local MUXES $20_1$-$20_4$ functions like a controllable switch. In particular, local MUX $20_1$ couples output node $30_1$ to one of internal signals A1-A3 or Logical 0 based on the value of control signal CTRL, MUX $20_2$ couples output node $30_2$ to one of internal signals B1-B2 or Logical 0 based on the value of control signal CTRL, MUX $20_3$ couples output node $30_3$ to one of internal signals D1, D2, E1 or Logical 0 based on the value of control signal CTRL, and MUX $20_4$ couples output node $30_4$ to one of internal signals C1-C3 or Logical 0 based on the value of control signal CTRL. Table 1 illustrates exemplary values of control signal CTRL and corresponding local MUX output states for a circuit including four, quad-input MUXES:

TABLE 1

| CTRL | Ouput Node $30_1$ | Ouput Node $30_2$ | Ouput Node $30_3$ | Ouput Node $30_4$ |
|---|---|---|---|---|
| 0000 | Logical 0 | Logical 0 | Logical 0 | Logical 0 |
| 0001 | A1 | Logical 0 | Logical 0 | Logical 0 |
| 0010 | A2 | Logical 0 | Logical 0 | Logical 0 |
| 0011 | A3 | Logical 0 | Logical 0 | Logical 0 |
| 0100 | Logical 0 | Logical 0 | Logical 0 | Logical 0 |
| 0101 | Logical 0 | Logical 0 | Logical 0 | Logical 0 |
| 0110 | Logical 0 | B1 | Logical 0 | Logical 0 |
| 0111 | Logical 0 | B2 | Logical 0 | Logical 0 |
| 1000 | Logical 0 | Logical 0 | Logical 0 | Logical 0 |
| 1001 | Logical 0 | Logical 0 | D1 | Logical 0 |
| 1010 | Logical 0 | Logical 0 | D2 | Logical 0 |
| 1011 | Logical 0 | Logical 0 | E1 | Logical 0 |
| 1100 | Logical 0 | Logical 0 | Logical 0 | Logical 0 |

TABLE 1-continued

| CTRL | Ouput Node $30_1$ | Ouput Node $30_2$ | Ouput Node $30_3$ | Output Node $30_4$ |
|---|---|---|---|---|
| 1101 | Logical 0 | Logical 0 | Logical 0 | C1 |
| 1110 | Logical 0 | Logical 0 | Logical 0 | C2 |
| 1111 | Logical 0 | Logical 0 | Logical 0 | C3 |

Thus, based on the value of control signal CTRL, when any one of internal signals A1-A3, B1-B2, C1-C3, D1-D2 or E1 is coupled to a corresponding one of output nodes $30_1$-$30_4$, all other output nodes on MUXES $20_1$-$20_4$ are coupled to Logical 0. As a result, only one of output nodes $30_1$-$30_4$ toggles at a time, which helps to reduce noise generated by and power consumed by the potentially long routing lines coupling output nodes $30_1$-$30_4$ to the input nodes of output OR gate 46.

As shown in FIG. 3, each of output nodes $30_1$-$30_4$ is coupled to a corresponding input node of output OR gate 46. Thus, based on the value of control signal CTRL, when any one of internal signals A1-A3, B1-B2, C1-C3, D1-D2 or E1 is coupled via MUXES $20_1$-$20_4$ to an input node of output OR gate 46, the remaining input nodes of output OR gate 46 are coupled to Logical 0. Therefore, external pin 40, which is coupled to the output node of output OR gate 46, may be used to monitor the corresponding internal signal A1-A3, B1-B2, C1-C3, D1-D2 or E1 selected by control signal CTRL. If output OR gate 46 includes a multi-bit output node, each bit of which is coupled to a corresponding one of external pins 40, the external pins may be used to monitor multiple bits of the internal signal A1-A3, B1-B2, C1-C3, D1-D2 or E1 selected by control signal CTRL.

In the example illustrated in FIG. 3, control signal CTRL functions as an address of the desired internal signal that is to be monitored on external pin 40. Indeed, based on the exemplary values of Table 1, the two most significant bits of control signal CTRL select one of local MUXES $20_1$-$20_4$, and the two least significant bits select one of the corresponding internal signals or Logical 0 for coupling to an input node of output OR gate 46. A control signal generator circuit may be used to generate control signal CTRL, as is known in the art. Persons-of ordinary skill in the art will understand that control signal addressing schemes other than that depicted in Table 1 may be used.

Alternatively, control signal CTRL may be provided by using an address bus on the integrated circuit. Indeed, most integrated circuits include an address bus that is used to address logic circuits on the device, such as internal registers (not shown) in circuit blocks A-E. Control signal CTRL may be provided by using all or a portion of the address bus. In particular, control signal CTRL may be generated by latching a "debug address" on the address bus that corresponds to the desired internal signal that is to be monitored. By latching the debug address, the desired internal signal may be continuously monitored on the external debug pin. Further, after the debug address has been latched, the address bus may be freed for normal addressing purposes so that the actual device operation may be observed.

Figure 4:
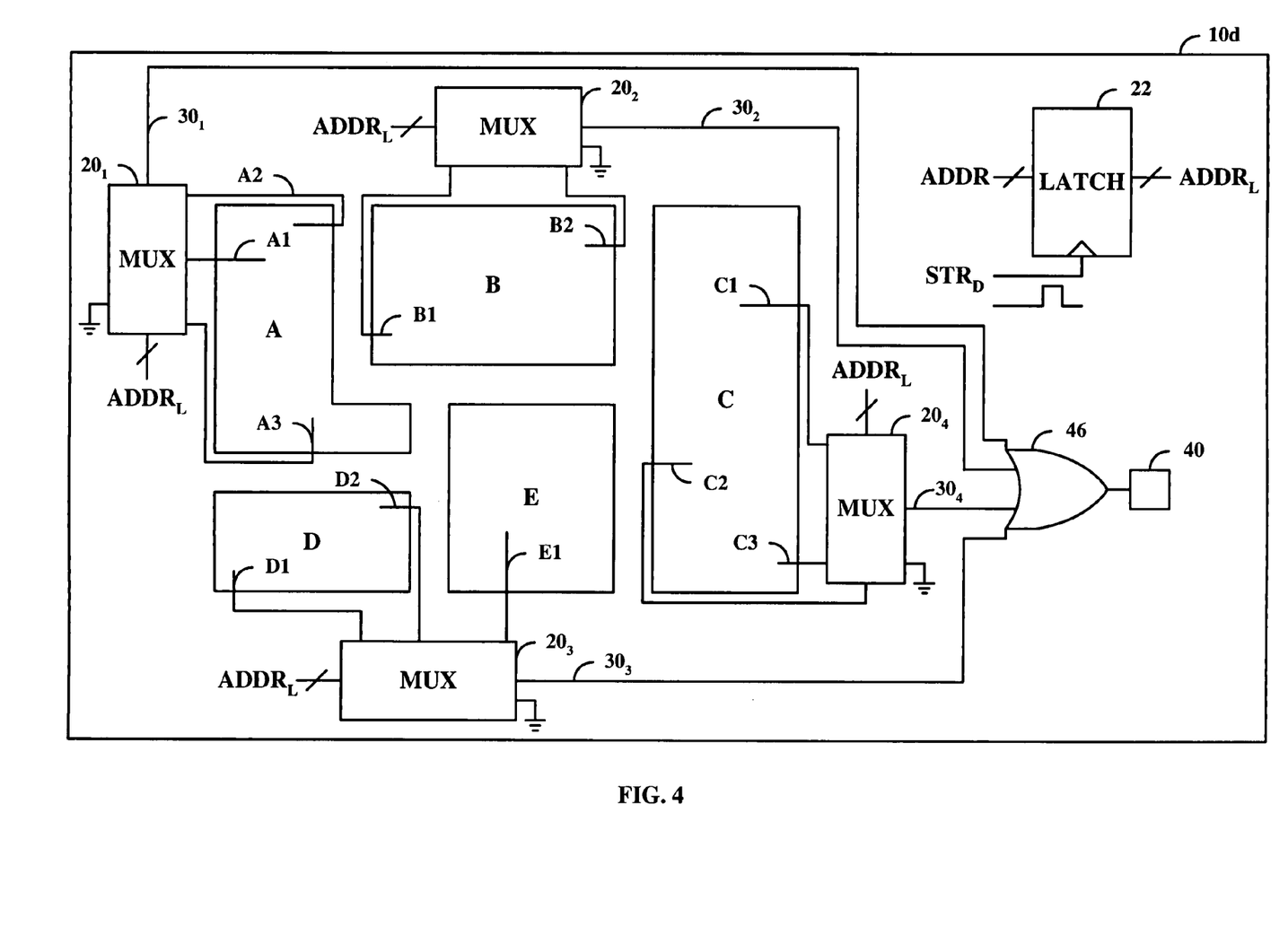
FIG. 4 is a block diagram of an alternative exemplary circuit for monitoring internal signals in an integrated circuit in accordance with this invention.

FIG. 4 illustrates an example of such an alternative embodiment, in which the control input node of each of MUXES $20_1$-$20_4$ is coupled to latched address bus $ADDR_L$. In particular, circuit 10d includes latch 22, which has an input coupled to address bus ADDR and a clock input coupled to a debug strobe signal $STR_D$. Latch 22 provides latched address bus $ADDR_L$ that is a latched version of the signals on address bus ADDR on the occurrence of strobe signal $STR_D$. Strobe signal $STR_D$ may be a digital signal that includes a pulse each time a debug address appears on address bus ADDR. In this regard, each internal signal A1-A3, B1-B2, C1-C3, D1-D2 or E1 may be mapped to a corresponding debug address on address bus ADDR, and any one of the internal signals may be monitored on external pin 40 by asserting the corresponding debug address on the address bus.

Figure 5:
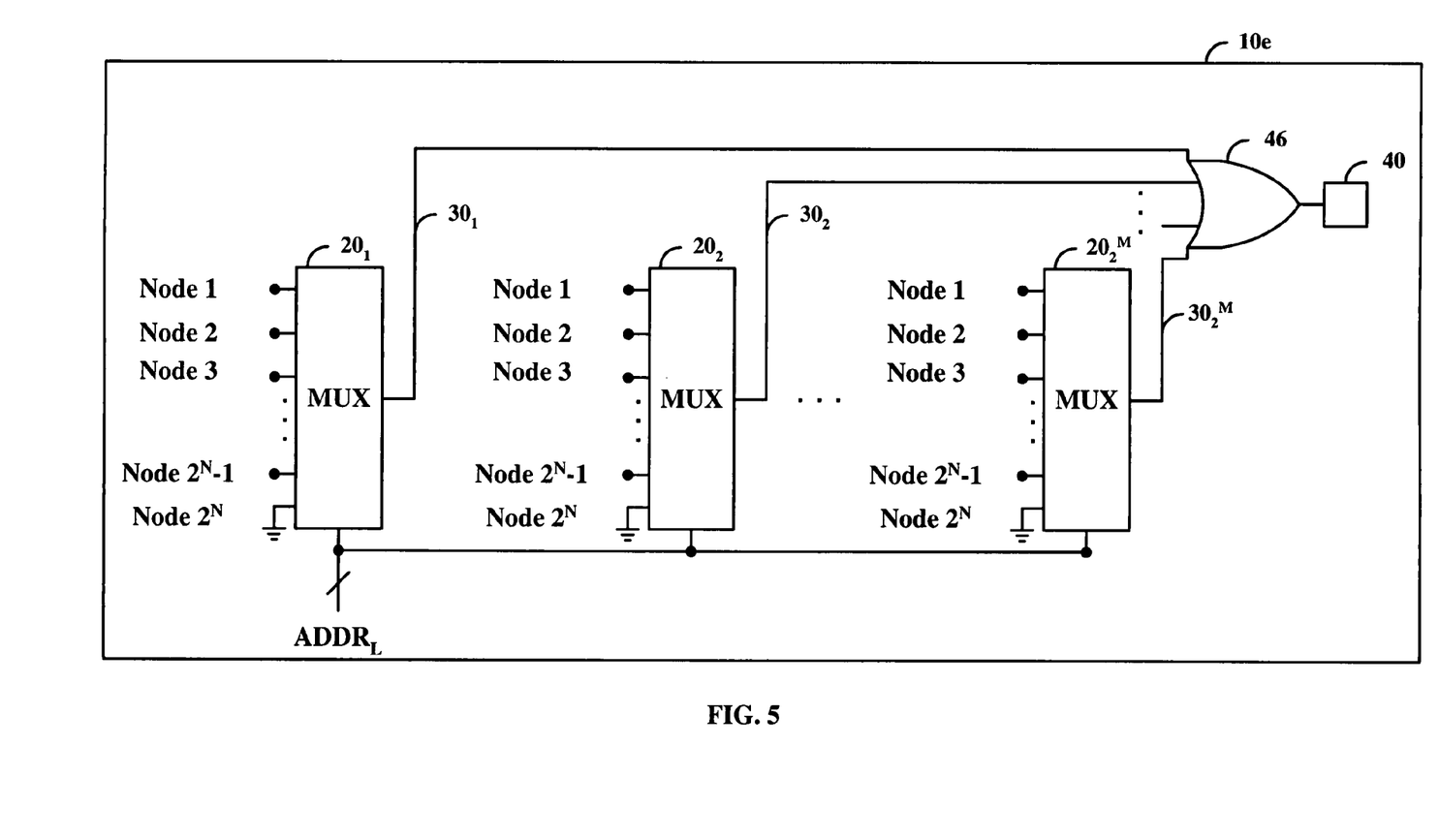
FIG. 5 is a block diagram of another alternative exemplary circuit for monitoring internal signals in an integrated circuit in accordance with this invention.

FIG. 5 illustrates a general example of this alternative embodiment. In particular, for an integrated circuit 10e that includes an address bus having M+N bits, up to $2^M$ MUX circuits $20_1, 20_2, \ldots, 20_2^M$, may be used to monitor up to $(2^{M+N}-2^M)$ internal signals of circuit blocks (not shown for simplicity) in the circuit. Specifically, each MUX circuit includes $2^N$ input nodes Node 1, Node 2, ..., Node $2^N$, at least one of which is coupled to Logical 0, and an output node 30. Output nodes $30_1, 30_2, \ldots 30_2^M$ of MUX circuits $20_1, 20_2, \ldots, 20_2^M$ are coupled to a corresponding input node of output OR gate 46.

Thus, if M=N=4, up to 16 MUX circuits $20_1, 20_2, \ldots, 20_{16}$ may be used to monitor up to 240 internal signals on external pin 40. Specifically, each MUX circuit includes 16 input nodes Node 1, Node 2, ..., Node 16, at least one of which is coupled to Logical 0. The remaining 15 input nodes may be coupled to up to 15 internal signals, and any unused input nodes may be coupled to Logical 0. Output nodes $30_1, 30_2, \ldots 30_{16}$ are coupled to corresponding input nodes of output OR gate 46, whose output node is coupled to external pin 40. Thus, based on the address asserted on address bus ADDR, any one of up to 240 internal signals may be monitored. In this example, the four most significant bits select the individual MUX circuit $20_1, 20_2, \ldots,$ or $20_{16}$, and the four least significant bits select the individual input node Node 1, Node 2, ..., or Node 16 of the selected MUX.

For example, input nodes Node 1, Node 2 and Node 3 of MUX $20_1$ may be coupled to internal signals A1, A2, A3, respectively, of a first circuit block (not shown), and all other input nodes may be coupled to Logical 0; input nodes Node 1 and Node 2 of MUX $20_2$ may be coupled to internal signals B1 and B2, respectively, of a second circuit block (not shown), and all other input nodes may be coupled to Logical 0; input nodes Node 1, Node 2, Node 3 and Node 4 of MUX $20_3$ may be coupled to internal signals C1, C2, C3 and C4, respectively, of a third circuit block (not shown), and all other input nodes may be coupled to Logical 0, and so on.

Thus, to monitor internal signal A2, the address 00000001 may be asserted on address bus ADDR and latched on latched address bus $ADDR_L$. In response, MUX $20_1$ will couple internal signal A2 to output node $30_1$, and all other output nodes $30_2, \ldots 30_{16}$ will be coupled to Logical 0. As a result, external pin 40, which is coupled to the output node of output OR gate 46, may be used to monitor internal signal A2. Similarly, to monitor internal signal C4, the address 00100011 may be asserted on address bus ADDR and latched on latched address bus $ADDR_L$. In response, MUX $20_3$ will couple internal signal C4 to output node $30_3$, and all other output nodes $30_1, 30_2, 30_4, \ldots 30_{16}$ will be coupled to Logical 0. As a result, external pin 40, may be used to monitor internal signal C4.

Any unused input nodes of MUX circuits $20_1, 20_2, \ldots, 20_{16}$ may be used to monitor additional internal signals in circuit blocks on integrated circuit 10e. Thus, in the above example, an additional internal signal A4 of the first circuit block may be monitored by coupling A4 to input node Node 4 of MUX $20_1$. Similarly, additional internal signals C5 and C6 of the third circuit block may be monitored by coupling C5 and C6 to input nodes Node 5 and Node 6, respectively, of MUX $20_3$. To monitor internal signal A4 on external pin 40, the address 00000011 may be asserted on address bus ADDR and latched on latched address bus $ADDR_L$. Likewise, to monitor internal signal C5 on external pin 40, the address 00100100 may be asserted on address bus ADDR and latched on latched address bus $ADDR_L$.

Figure 6:
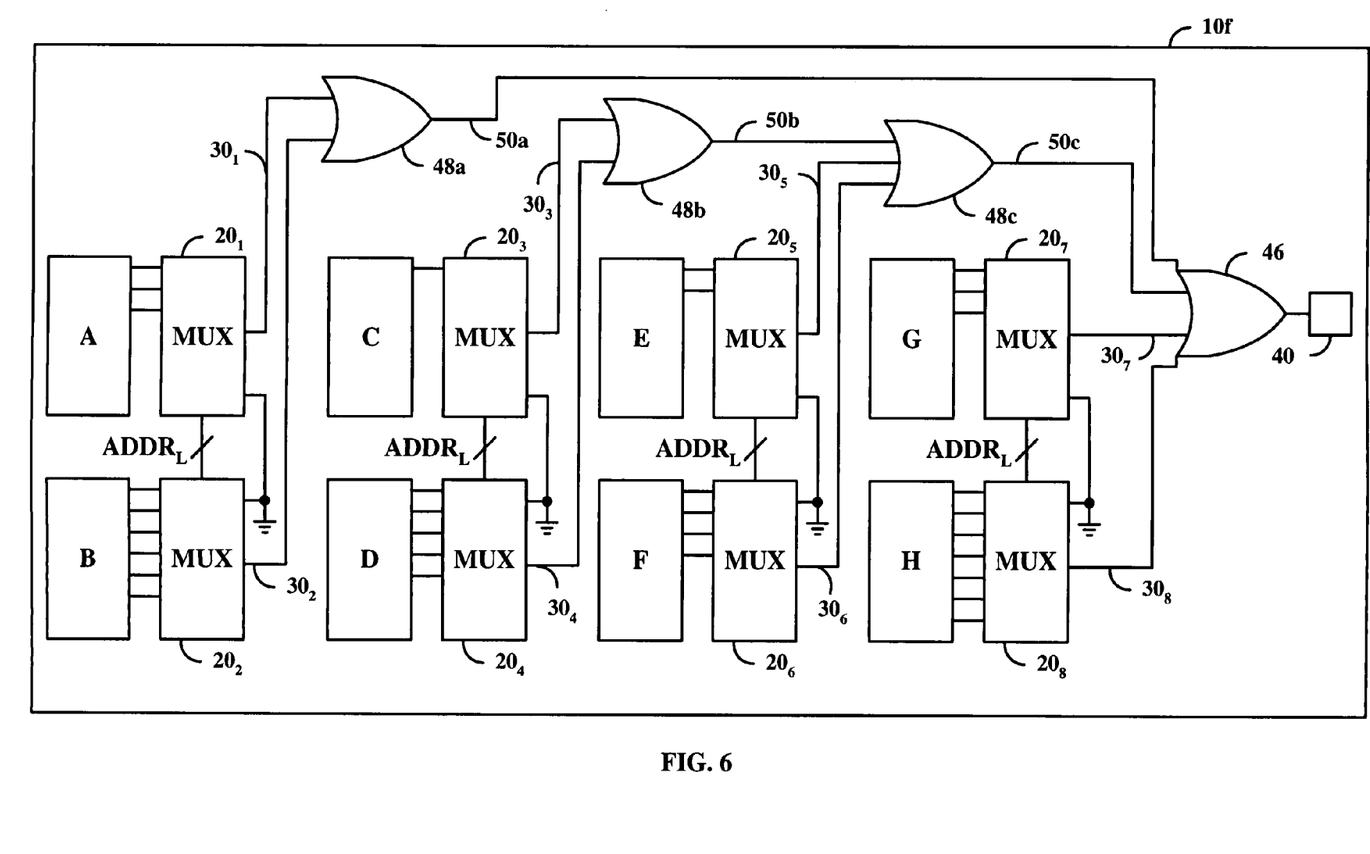
FIG. 6 is a block diagram of still another alternative exemplary circuit for monitoring internal signals in an integrated circuit in accordance with this invention.

To prevent output OR gate 46 from becoming impractically large as the number of monitored internal signal increases, local OR gates may be distributed throughout the integrated circuit. Referring now to FIG. 6, an exemplary embodiment of circuits in accordance with this aspect of the invention is described. In particular, integrated circuit 10f includes eight circuit blocks A-H, eight local MUXES $20_1$-$20_8$, three local OR gates 48a-48c, output OR gate 46, and external pin 40. As described below, local OR gates 48a-48c reduce the number of signals that are routed from local MUXES $20_1$-$20_8$ to output OR gate 46.

In the illustrated example, three internal signals of circuit block A are coupled to the input nodes of local MUX $20_1$, whose output node $30_1$ is coupled to a first input node of local OR gate 48a. In addition, six internal signals of circuit block B are coupled to the input nodes of local MUX $20_2$, whose output node $30_2$ is coupled to a second input node of local OR gate 48a. Output node 50a of local OR gate 48a is coupled to a first input node of output OR gate 46. Thus, local OR gate 48a concentrates output nodes $30_1$ and $30_2$ to a single output node 50a, which in turn is coupled to a first input node of output OR gate 46.

Similarly, an internal signal of circuit block C is coupled to an input node of local MUX $20_3$, whose output node $30_3$ is coupled to a first input node of local OR gate 48b. Moreover, five internal signals of circuit block D are coupled to the input nodes of local MUX $20_4$, whose output node $30_4$ is coupled to a second input node of local OR gate 48b. Thus, local OR gate 48b concentrates output nodes $30_3$ and $30_4$ to a single output node 50b, which in turn is coupled to a first input node of local OR gate 48c.

Likewise, two internal signals of circuit block E are coupled to the input nodes of local MUX $20_5$, whose output node $30_5$ is coupled to a second input node of local OR gate 48c. Further, four internal signals of circuit block F are coupled to the input nodes of local MUX $20_6$, whose output node $30_6$ is coupled to a third input node of local OR gate 48c. Thus, local OR gate 48c concentrates three output nodes 50b, $30_5$ and $30_6$ to a single output node 50c, which in turn is coupled to a second input node of output OR gate 46.

Finally, three internal signals of circuit block G are coupled to the input nodes of local MUX $20_7$, whose output node $30_7$ is coupled to a third input node of output OR gate 46. Additionally, seven internal signals of circuit block H are coupled to input nodes of local MUX $20_8$, whose output node $30_8$ is coupled to a fourth input node of output OR gate 46. Thus, by using local OR gates distributed throughout integrated circuit 10f, output OR gate 46 requires only four input nodes, and therefore may be kept at a manageable size.

To monitor an internal signal on integrated circuit 10f, the debug address of the desired internal signal is asserted on address bus ADDR. For example, to monitor the second internal signal of circuit block F, address 010100001 may be asserted on address bus ADDR and latched on latched address bus $ADDR_L$. In response, MUX $20_6$ will couple the second internal signal to output node $30_6$, and all other output nodes $30_1$, $30_2$, ... $30_5$, $30_7$, and $30_8$ will be coupled to Logical 0. In addition, output nodes 50a and 50b of local OR gates 48a and 48b will be coupled to Logical 0. Output node 50c of OR gate 48c, in contrast, will be coupled to output node $30_6$, and the output node of output OR gate 46 will be coupled to output node 50c. As a result, external pin 40, which is coupled to the output node of output OR gate 46, may be used to monitor the second internal signal of circuit block F.

The foregoing merely illustrates the principles of this invention, and various modifications can be made by persons of ordinary skill in the art without departing from the scope and spirit of this invention. For example, output OR gate 46 may have a first number of output bits (e.g., 64 bits) coupled to a corresponding first number of external pins (e.g., 64 pins). Alternatively, a second level of addressing may be used to selectively couple any subset of the output bits of output OR gate 46 (e.g., any 16 of the 64 bits) to a corresponding second number of external pins (e.g., 16 pins). In this regard, the second level of addressing may be used to reduce the number of external pins used for debug purposes. In addition, external pins 40 may be dual-purpose pins that have a first mode of operation for debugging purposes, and a second mode of operation for regular circuit operation. All such variations and modifications are within the scope of this invention.

The invention claimed is:

1. An integrated circuit comprising:
   first and second circuit blocks each comprising a first internal node;
   first and second multiplexer circuits each comprising first and second input nodes, a control node, and an output node, the first input node of the first multiplexer circuit coupled to the first internal node of the first circuit block, the first input node of the second multiplexer circuit coupled to the first internal node of the second circuit block, the second input nodes of the first and second multiplexer circuits coupled to logical 0, the control signal nodes of the first and second multiplexer circuits coupled to a control signal; and
   an OR gate comprising a first input node coupled to the output node of the first multiplexer circuit, a second input node coupled to the output node of the second multiplexer circuit, and an output node;
   wherein the control signal may be used to select the first internal node of the first circuit block or the first internal node of the second circuit block for monitoring at the output node of the OR gate.

2. The integrated circuit of claim 1, wherein the first multiplexer circuit is located on an outside periphery of the first circuit block.

3. The integrated circuit of claim 1, wherein the first multiplexer circuit is embedded within the first circuit block.

4. The integrated circuit of claim 1, wherein the first multiplexer circuit is located on an outside periphery of the first circuit block, and the second multiplexer circuit is located on an outside periphery of the second circuit block.

5. The integrated circuit of claim 1, wherein the first multiplexer circuit is embedded within the first circuit block, and the second multiplexer circuit is embedded within the second circuit block.

6. The integrated circuit of claim 1, wherein the first input node of the first multiplexer circuit comprises a multi-bit input node.

7. The integrated circuit of claim 1, wherein the first input node of the first multiplexer circuit comprises a single-bit input node.

8. The integrated circuit of claim 1, wherein the control signal comprises a multi-bit signal.

9. The integrated circuit of claim 1, wherein the control signal comprises an address.

10. The integrated circuit of claim 1, further comprising an address bus coupled to the control nodes of the first and second multiplexer circuits.

11. The integrated circuit of claim 10, further comprising a latch coupled between the address bus and the control nodes of the first and second multiplexer circuits.

12. The integrated circuit of claim 1, wherein the output node of the OR gate comprises a first number of bits.

13. The integrated circuit of claim 12, wherein the output node of the OR gate is coupled to a first number of external pins.

14. The integrated circuit of claim 12, wherein the output node of the OR gate is coupled to a second number of external pins less than the first number of bits.

15. A method for debugging an integrated circuit, the method comprising:
   providing first and second circuit blocks each comprising a first internal node;
   providing first and second multiplexer circuits each comprising first and second input nodes, a control node, and an output node;
   coupling the first input node of the first multiplexer circuit to the first internal node of the first circuit block;
   coupling the first input node of the second multiplexer circuit to the first internal node of the second circuit block;
   coupling the second input nodes of the first and second multiplexer circuits to logical 0;
   coupling the control signal nodes of the first and second multiplexer circuits coupled to a control signal;
   providing an OR gate comprising a first input node, a second input node and an output node;
   coupling the first input node of the OR gate to the output node of the first multiplexer circuit;
   coupling the second input node of the OR gate to the output node of the second multiplexer circuit; and
   using the control signal to select the first internal node of the first circuit block or the first internal node of the second circuit block for monitoring at the output node of the OR gate.

16. The method of claim 15, further comprising providing the first multiplexer circuit is located on an outside periphery of the first circuit block.

17. The method of claim 15, further comprising embedding the first multiplexer circuit within the first circuit block.

18. The method of claim 15, further comprising providing the first multiplexer circuit on an outside periphery of the first circuit block, and providing the second multiplexer circuit on an outside periphery of the second circuit block.

19. The method of claim 15, further comprising embedding the first multiplexer circuit within the first circuit block, and embedding the second multiplexer circuit within the second circuit block.

20. The method of claim 15, wherein the first input node of the first multiplexer circuit comprises a multi-bit input node.

21. The method of claim 15, wherein the first input node of the first multiplexer circuit comprises a single-bit input node.

22. The method of claim 15, wherein the control signal comprises a multi-bit signal.

23. The method of claim 15, wherein the control signal comprises an address.

24. The method of claim 15, further comprising providing an address bus coupled to the control nodes of the first and second multiplexer circuits.

25. The method of claim 24, further comprising providing a latch coupled between the address bus and the control nodes of the first and second multiplexer circuits.

26. The method of claim 15, wherein the output node of the OR gate comprises a first number of bits.

27. The method of claim 26, wherein the output node of the OR gate is coupled to a first number of external pins.

28. The method of claim 26, wherein the output node of the OR gate is coupled to a second number of external pins less than the first number of bits.

* * * * *